(12) United States Patent
Shin (10) Patent No.: US 6,212,249 B1
(45) Date of Patent: *Apr. 3, 2001

(54) DATA SEPARATION CIRCUIT AND METHOD

(75) Inventor: Byeong Cheol Shin, Kyongsangbuk-do (KR)

(73) Assignee: Hyundai Electronics Industries Co., Ltd., Kyoungki-Do (KR)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/921,586

(22) Filed: Sep. 2, 1997

(30) Foreign Application Priority Data

Sep. 2, 1996 (KR) .................................... 96-37839

(51) Int. Cl.[7] ................... H04L 7/02; H04L 7/04
(52) U.S. Cl. ............... 375/376; 375/362; 360/51; 327/156; 327/161
(58) Field of Search ................... 375/327, 362, 375/376, 354, 359, 360, 371, 373, 375; 60/46, 51, 65; 327/141, 147, 149, 153, 156, 158, 161

(56) References Cited

U.S. PATENT DOCUMENTS

| | | | |
|---|---|---|---|
| 4,472,818 | 9/1984 | Zapisek et al. | 375/371 |
| 4,563,657 | * 1/1986 | Qureshi et al. | 331/25 |
| 5,212,601 | * 5/1993 | Wilson | 360/51 |
| 5,260,842 | * 11/1993 | Leake et al. | 360/51 |
| 5,272,730 | * 12/1993 | Clark | 375/376 |
| 5,278,702 | * 1/1994 | Wilson et al. | 360/51 |
| 5,570,243 | * 10/1996 | Mattison | 360/51 |
| 5,808,971 | * 9/1998 | Alini et al. | 368/107 |
| 5,838,512 | * 11/1998 | Okazaki | 360/51 |

* cited by examiner

Primary Examiner—Young T. Tse (57) ABSTRACT

The data separation method and circuit generate a reference clock in synchronization with data being read. A digital phase locked loop then generates a window signal based on the reference clock. A data/clock separating part divides the read data into a data signal and a clock signal based on the window signal.

34 Claims, 10 Drawing Sheets

C:clock area   D:data area

| phase control value | window state |
|---|---|
| +2,+1,0,−1,−2 | no variation |
| +5,+4,+3 | window variation(Increment change;IC) |
| −5,−4,−3 | window varation(Decrement change;DC) |

DATA SEPARATION CIRCUIT AND METHOD

BACKGROUND OF THE INVENTION

1. Field of the Invention

The present invention relates to a data separation operation performed by a floppy disk controller and, more particularly, to a data separation circuit and method which use a digital phase locked loop (DPLL).

2. Discussion of Related Art

Figure 1:
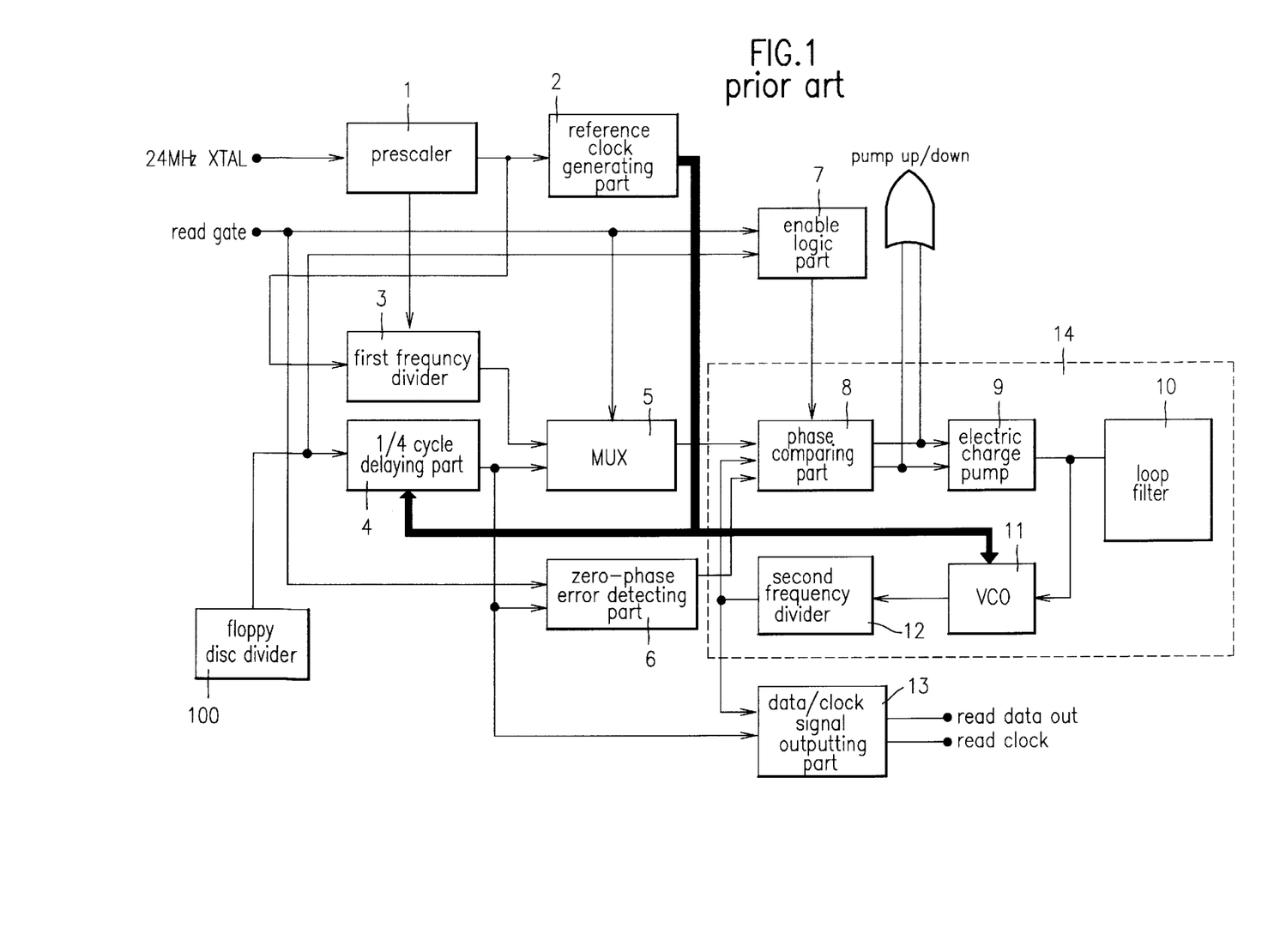
FIG. 1 is a block diagram of a conventional data separation circuit.

With reference to the attached drawings, a conventional data separation circuit will be described below. FIG. 1 is a block diagram of a conventional data separation circuit. A conventional internal data separation circuit roughly includes an analog PLL part and its related circuits. As shown in FIG. 1, the circuit has a prescaler 1 for leveling the magnitude of the signal output from a reference crystal XTAL, which has a predetermined reference frequency of 24 MHz, into a specific size; a reference clock generating part 2 for receiving the frequency levelled by the prescaler 1 and generating a system reference clock; a first frequency divider 3 for dividing the frequency levelled by the prescaler 1; a ¼ cycle delaying part 4 for delaying by ¼ cycle of the system reference clock the data read out of the disk driver in synchronization with the reference clock of the reference clock generating part 2; and a MUX 5 for multiplexing the frequency-divided signal output by the first frequency divider 3 and the delayed read data signal output by the ¼ cycle delaying part 4 based on a signal indicative of a read gate's logic state. The read gate becomes logic high when the read data is applied (See FIGS. 4C and 4D).

A zero-phase error detecting part 6 also receives the signal indicative of the read gate's logic state and the delayed read data signal, and detects the zero phase error. An enable logic part 7 outputs an enable signal in accordance with the read data and the read gate's logic state to an analog phase locked loop circuit (PLL) 14.

As shown in FIG. 1, the analog PLL 14 includes a phase comparing part 8 for comparing, in accordance with the enable signal, the output signal from the MUX 5 with the frequency-divided signal fed-back by the analog PLL 14 to thereby detect the phase difference between these signals and generate an up/down signal. The analog PLL 14 further includes an electric charge pump 9 for outputting a control voltage which varies with the frequency and phase of the clock signal by charging/discharging in response to the up/down signal output by the phase comparing part 8; a loop filter 10 for controlling the width and magnitude of the control voltage, which has a ripple form, produced by the charge/discharge currents of the electric charge pump 9; a voltage controlled oscillator (VCO) 11 for generating, in synchronization with the reference clock, a signal whose frequency varies in accordance with the control voltage; and a second frequency divider 12 for determining a frequency-dividing ratio according to the data rate to thereby frequency-divide the oscillating frequency of the signal output from the VCO 11.

The circuit of FIG. 1 also includes a data/clock signal outputting part 13 for dividing a data and a clock signal from the delayed read data signal output by the ¼ cycle delaying part 4 based on the frequency-dividing signal output by the second frequency divider 12. The data/clock signal outputting part 13 then outputs the divided clock and data signals.

The thus-structured conventional data separation circuit divides data by controlling the VCO frequency, gain, and current applied to the circuit according to various conditions such as the data rate. While the conventional data separation circuit effectively retrieves data, designing such a circuit is quite difficult. If the data separation circuit design includes an analog PLL, as in the conventional art, the size of the circuit increases. As a result, additional controls, for instance, for VCO frequency, gain, and component current are thus needed for the data separation operation. Consequently, external influences can make the circuit unstable.

SUMMARY OF THE INVENTION

One object of the present invention is to provide a data separation circuit and method that substantially obviate one or more of the problems and/or disadvantages discussed above with respect to the conventional art.

Another object of the present invention is to provide a data separation circuit which maintains its stability by using a digital phased locked loop (DPLL).

These and other objects, in accordance with the purpose of the present invention and as embodied and broadly described, are achieved by providing a data separation circuit, comprising: generating means for generating a reference clock according to a data rate at which data is being read; a digital phase locked loop generating a window signal based on said reference clock; and output means for outputting a data signal and a clock signal based on said read data and said window signal.

These and other objects are further achieved by providing a method of separating data, comprising the steps of: (a) generating a reference clock according to a data rate at which data is being read; (b) generating a window signal based on said reference clock; and (c) outputting a data signal and a clock signal based on said read data and said window signal.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

BRIEF DESCRIPTION OF THE ATTACHED DRAWINGS

The accompanying drawings, which are included to provide a further understanding of the invention and are incorporated in and constitute a part of this specification, illustrate embodiments of the invention and together with the description serve to explain the principles of the drawings.

In the drawings.

DETAILED DESCRIPTION OF PREFERRED EMBODIMENT

Figure 2:
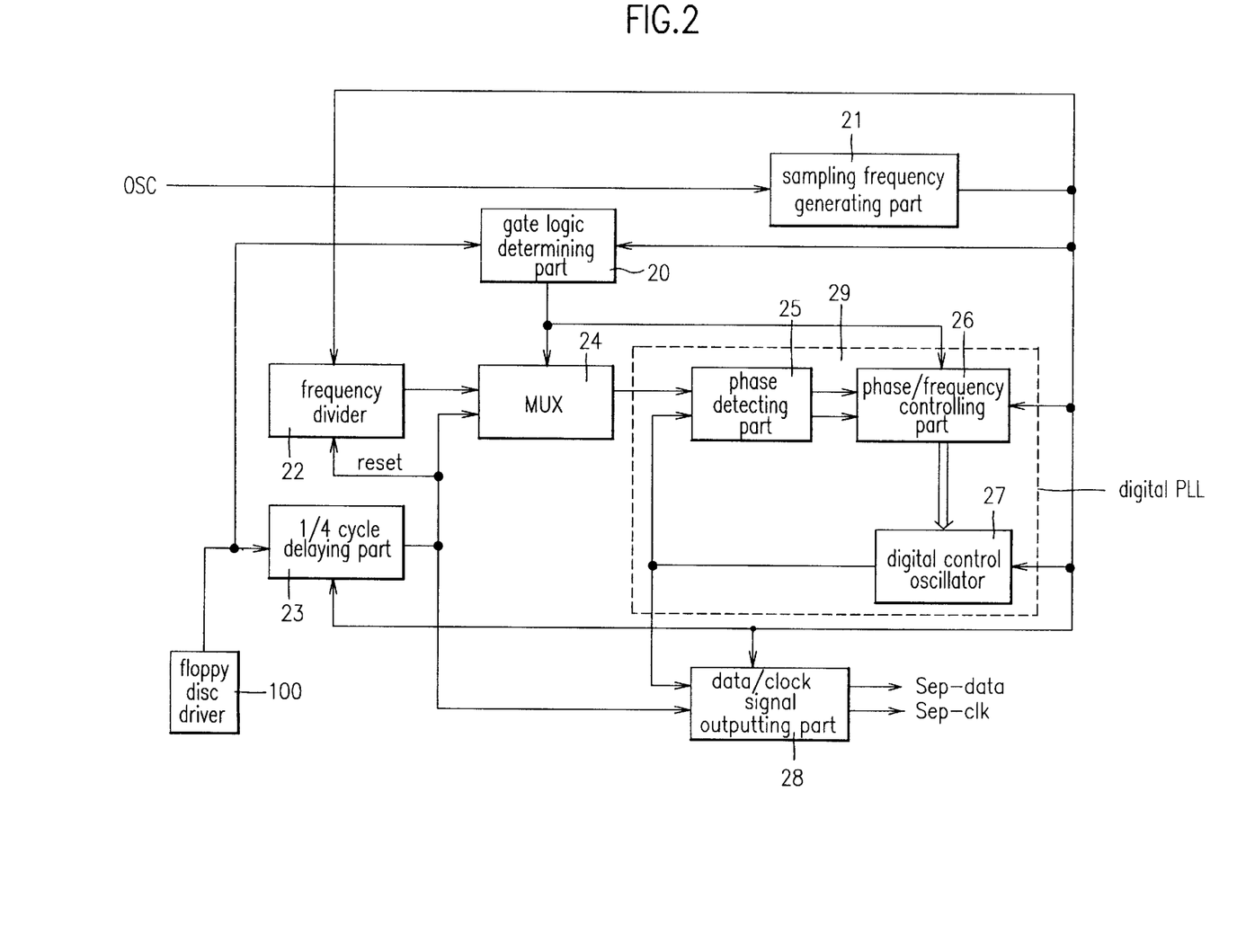
FIG. 2 illustrates a data separation circuit according to the present invention.

FIG. 2 illustrates a data separation circuit according to the present invention. As shown in FIG. 2, a sampling frequency generating part 21 receives an oscillator OSC signal having a predetermined oscillation frequency, and generates a sampling frequency having a fixed reference frequency therefrom. The sampling frequency signal serves as a synchronizing signal, and is received by a gate logic determining part 20, a ¼ cycle delaying part 23, a digital phase locked loop (DPLL) 29, and a data/clock signal outputting part 28. Based on the sampling frequency signal, the operation of these components is synchronized.

The ¼ cycle delaying part 23 and the gate logic determining part 20 also receive the data read from a floppy disk by the floppy disk drive. The ¼ cycle delaying part 23 delays the read data by ¼ of a cycle. A cycle is the minimum interval for changing the next pulse of the window signal, and as discussed in detail below depends on the data rate of the floppy disk being driven by the floppy disk drive. The output of the ¼ cycle delaying part 23 is applied to the frequency divider 22 as a reset signal to synchronize the output of the frequency divider 22 with the output of the ¼ cycle delaying part 23. The frequency divider 22 frequency divides the sampling frequency signal by a predetermined dividing ratio.

As shown in FIG. 2, a multiplexer 24 receives both the delayed read data and the output of the frequency divider 22. The multiplexer 24 multiplexes these two signals based on a gate signal received from the gate logic determining part 20. The gate logic determining part 20 determines, in synchronization with the sampling frequency signal, a logic state of the read gate based on the read data.

Figure 5A:
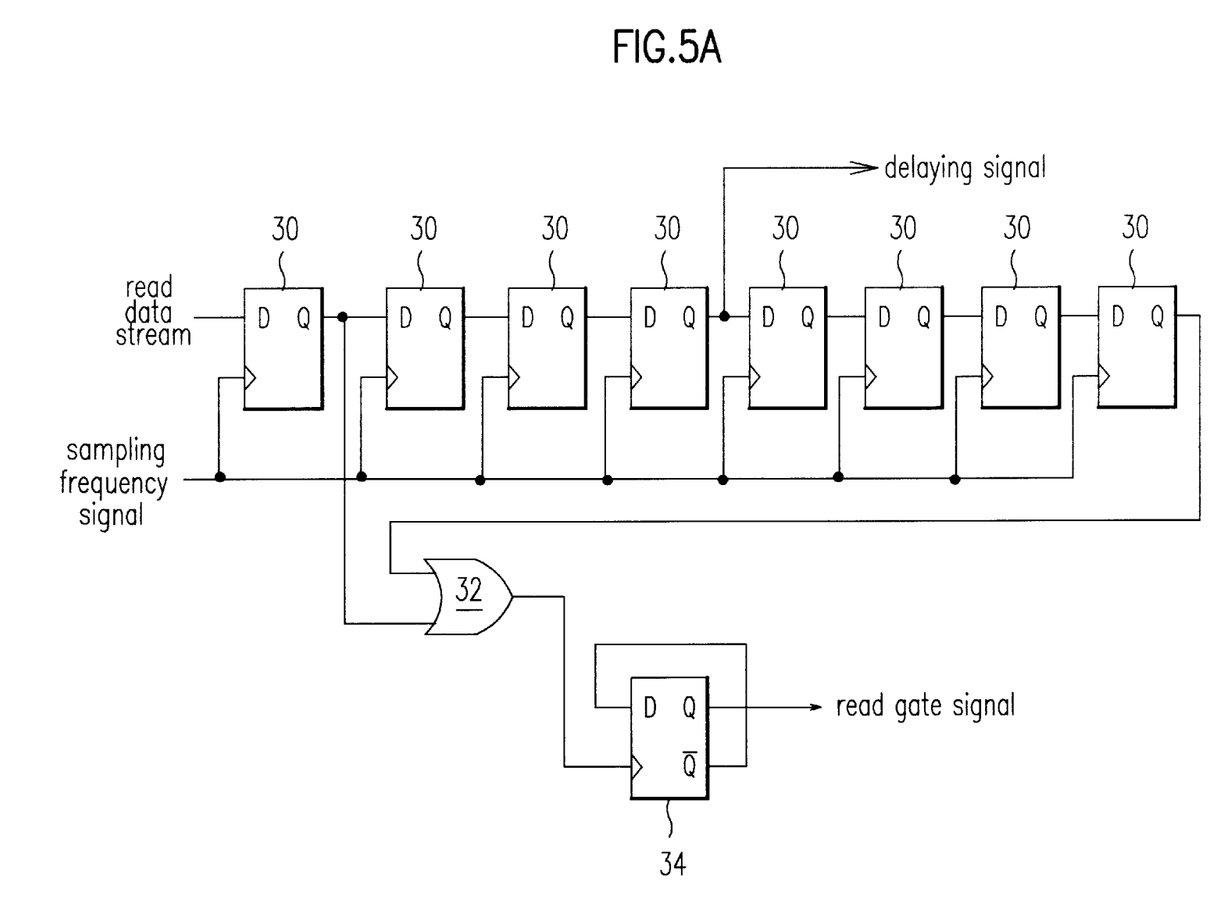
FIG. 5A illustrates the gate logic determining part and the ¼ cycle delaying part of FIG. 2 in greater detail.

FIG. 5A illustrates the gate logic determining part 20 and the ¼ cycle delaying part 23 in greater detail. As shown, the gate logic determining part 20 and the ¼ cycle delaying part 23 are jointly constructed of a plurality of serially connected D-flipflops 30 which are enabled by the sampling frequency signal. The first one of the plurality of serially connected D-flipflops 30 receives the read data stream, and the delayed read data is output from a fourth one of the plurality of serially connected D-flipflops 30. The output of the first one and the last one of the plurality of serially connected D-flipflops 30 is connected to an OR gate 32. The output of the OR gate 32 enables a D-flipflop 34 having its inverted output connected to its input. The non-inverted output of the D-flipflop 34 outputs the read gate signal.

The output of the multiplexer 24 serves a reference clock for the DPLL 29. Based on this reference clock and the read gate signal, the DPLL 29 generates a window signal. As shown in FIG. 2, the operation of the DPLL 29 is synchronized in accordance with the sampling frequency signal.

The DPLL 29 includes a phase detecting part 25, a phase/frequency controlling part 26, and a digital control oscillator 27. The phase detecting part 25 detects the phase error between the reference clock output by the multiplexer 24 and the window signal. The phase detecting part 25 outputs a first and second error signal wherein the first error signal indicates phase error in a first direction and the second error signal indicates phase error in a second direction opposite to the first direction. The phase/frequency controlling part 26 receives both the first and second phase error signals, and generates a first and second count. The first count represents a total amount of time the phase error in the first direction exists during a predetermined period of time, and the second count represents a total amount of time the phase error in the second direction exists during a second predetermined period of time. The phase/frequency controlling part 26 establishes the predetermined period of time as a time period between edges of the read gate signal. Based on the first and second count, the phase/frequency controlling part 26 generates a control signal to the digital control oscillator 27 in synchronization with the sampling frequency signal. The digital control oscillator 27, also in synchronization with the sampling frequency signal, generates the window signal. Specifically, based on the control signal, the digital control oscillator 27 increases, decreases, or maintains the length of time between pulses of the window signal.

As shown in FIG. 2, a data/clock signal outputting part 28 receives the delayed read signal and the window signal, and divides the delayed read data signal into a data signal and a clock signal based on the window signal.

Figure 3A:
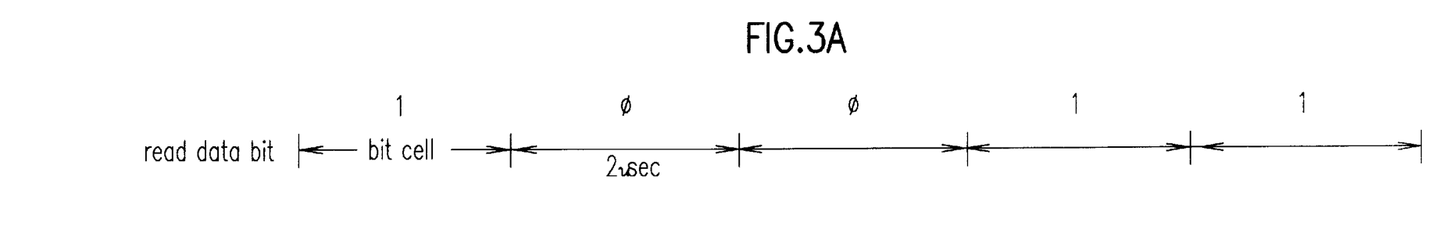
FIG. 3A illustrates the read data bits determined based on the delayed read data stream illustrated in FIG. 3B and the window signal illustrated in FIG. 3C.
Figure 3B:
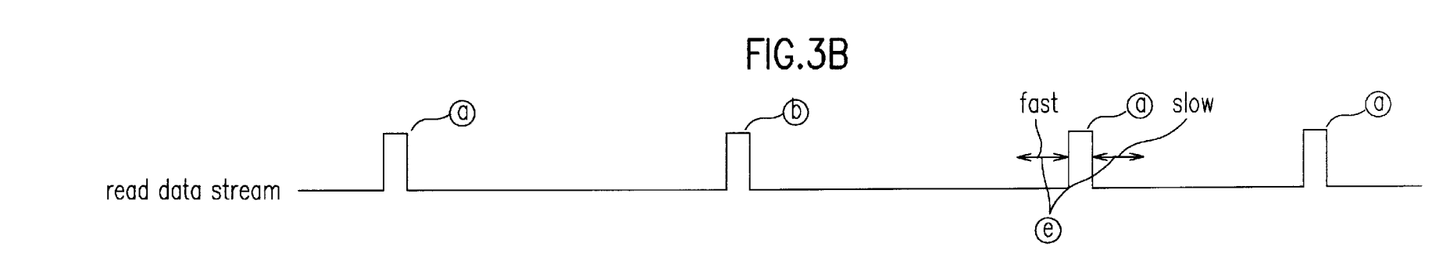
FIG. 3B illustrates an example of a delayed read data stream.
Figure 3C:
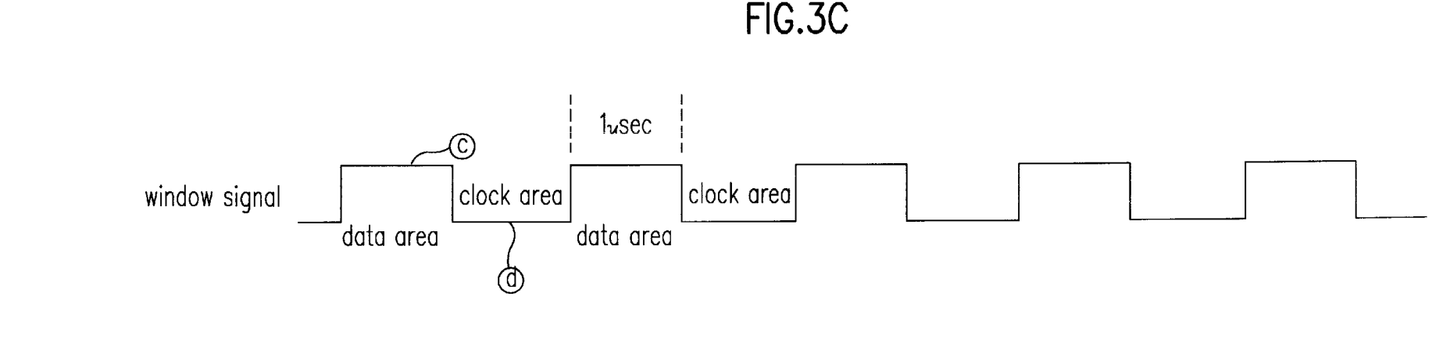
FIG. 3C illustrates a window signal corresponding to the delayed read data stream of FIG. 3B.

The operation of the data separation circuit according to the present invention will now be described in detail with respect to FIGS. 3A–10D. Referring to FIGS. 3A–3C, the operation of the data/clock signal outputting part 28 will be described. FIG. 3B illustrates an example of a delayed read data stream which the data/clock signal outputting part 28 receives from the ¼ cycle delaying part 23, and FIG. 3C illustrates a window signal corresponding to the delayed read data stream which the data/clock signal outputting part 28 receives from the DPLL 29. Based on the window signal, the data/clock signal outputting part 28 divides the delayed read data stream into a data signal and a clock signal.

As shown in FIG. 3C, the window signal includes a data area c and a clock area d. When a transition pulse, such as transition pulses a in FIG. 3B, in the delayed read data stream occur within the data area c of the window signal, the data/clock signal outputting part 28 determines, as shown in FIG. 3A, a read data bit of "1". If no transition pulse appears in the data area c of the window signal, then, as shown in FIG. 3A, the data/clock signal outputting part 28 determines a read data bit of "0". Furthermore, if a transition pulse of the read data stream, such as transition pulse b in FIG. 3B, occurs during the clock area d of the window signal, then the data/clock signal outputting part 28 determines that the transition pulse of the read data stream is a clock pulse.

By determining read data bits and clock pulses in the above manner, the data/clock signal outputting part 28 divides the data and clock signal from the read data stream, and outputs separate data and clock signals.

As further shown in FIG. 3B, during operation of the floppy disk drive, the transition pulse of the read data stream may occur earlier or later because of, for example, irregularities in the rotation of the floppy disk drive motor or the diameter of the floppy disk. As a result, the period of time between transition pulses may decrease or increase as shown by arrows e in FIG. 3B. Stated another way, the data rate with which the data is read from the floppy disk may increase (i.e., a fast state) or decrease (i.e., a slow state). For the data/clock signal outputting part 28 to continue operating properly, the window signal must change in a similar manner. As discussed in detail below, the DPLL 29 increases or decreases the length of time between pulses of the window signal in accordance with changes in the data rate based on a reference clock received from the multiplexer 24.

Figure 4A:
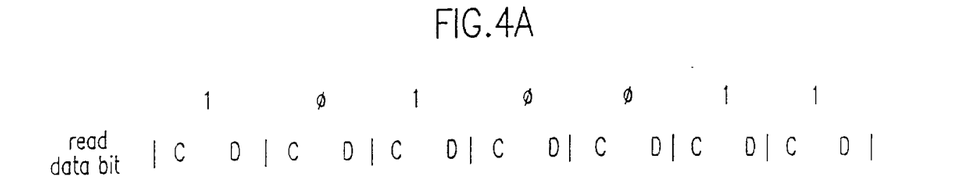
FIG. 4A illustrates the read data bit stream of FIG. 3A.

The generation of this reference clock will now be described with reference to FIGS. 4A–4E and 5A–5E. For purposes of discussion, the read data bit stream of FIG. 3A will be used. Accordingly, FIG. 4A illustrates the read data bit stream of FIG. 3A with the data area c and clock area d for each bit illustrated.

The sampling frequency generating part 21 receives the OSC signal having a predetermined oscillating frequency, and frequency divides the OSC signal according to the predetermined data rate of the floppy disks upon which the floppy disk drive operates. For instance, if the data of the floppy disk has a data rate of modified frequency modulation (MFM), the frequency of the sampling frequency signal becomes 16 MHz. If the data rate of the floppy disk is 300 k MFM, the sampling frequency generating part 21 generates a sampling frequency signal having a frequency of 9.6 MHz. For a floppy disk with a data rate of 250 k MFM, the sampling frequency generating part 21 generates a sampling frequency signal having a frequency of 8 MHz. Accordingly, when the floppy disk has a data rate of c MFM, the minimum interval for changing the next pulse of the window signal is 2 $\mu$s. Consequently, the sampling frequency signal will have 16 sample clock pulses every 2 $\mu$s period. As described in detail below with respect to the DPLL 29, each one of these sixteen pulses defines one slice, and the sampling frequency signal serves as an operation clock for the DPLL 29.

For the purposes of discussion, it will be assumed for the remainder of this application that the data rate of the floppy disk is c MFM such that the length of one cycle is 2 $\mu$s, and sixteen pulses of the sample frequency signal occur each 2$\mu$ cycle. Accordingly, FIGS. 3A–10D have been produced assuming a 2 $\mu$s cycle. As such, FIG. 3A illustrates that each data bit is determined in one cycle (i.e., 2 $\mu$s) and the data area c and clock area d of the window signal each have a length of one-half of a cycle (i.e., 1 $\mu$s).

The ¼ cycle delaying part 23 receives the data read from the floppy disk by the floppy disk drive, and delays the read data stream by ¼ cycle. Accordingly, as shown in FIG. 5A, the read data stream is delayed by four pulses of the sampling frequency signal by extracting, as the delayed read data, the output from the fourth one of the plurality of serially connected D-flipflops 30 wherein the read data stream is input to the first one of the plurality of serially connected D-flipflops 30.

Figure 5B:
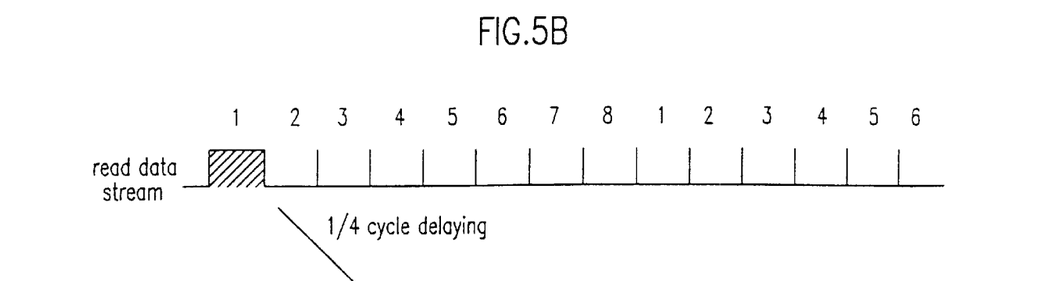
FIG. 5B illustrates a read data stream.
Figure 5C:
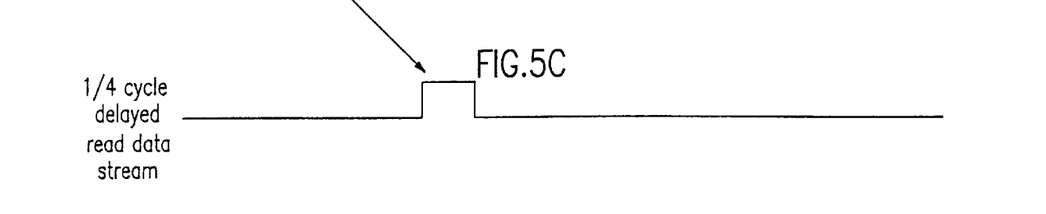
FIG. 5C illustrates the delayed read data stream for the read data stream of FIG. 5B.
Figure 5D:
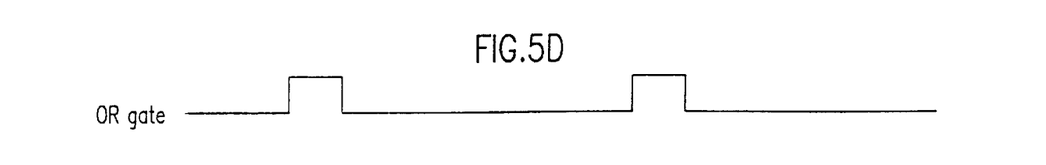
FIG. 5D illustrates the output of the OR gate in FIG. 5A when the read data stream is as shown in FIG. 5B.
Figure 5E:
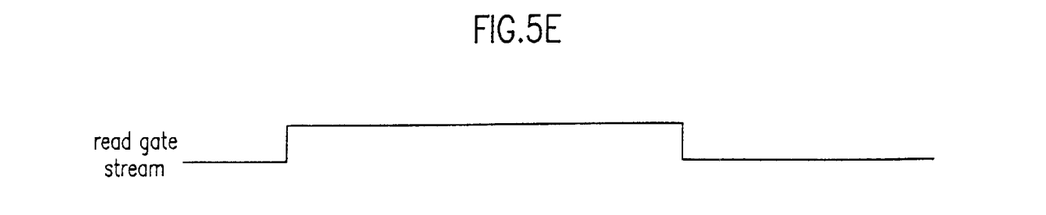
FIG. 5E illustrates the read gate signal when the read data stream is as shown in FIG. 5B.

As shown in FIG. 5B, if the read data stream has a transition pulse at a first pulse of the sampling frequency signal, the delayed read data stream has a corresponding pulse at the fifth transition pulse of the sampling frequency signal as shown in FIG. 5C. As further shown in FIG. 5A, the output of the first one of the D-flipflops 30, and the output of the last one of the D-flipflops 30 is received by the OR gate 32. Accordingly, the OR gate 32 receives the read data stream and the read data stream delayed by ½ a cycle. The output of the OR gate 32 is illustrated in FIG. 5D. The output of the OR gate 32 serves as an enable signal for the D-flipflop 34. As shown in FIG. 5A, the inverted output of the D-flipflop 34 is connected to the input of the D-flipflop 34, while the non-inverted output of the D-flipflop 34 serves as the output of the read gate signal. FIG. 5E illustrates the read gate signal when the read data stream is as shown in FIG. 5B.

Figure 4B:
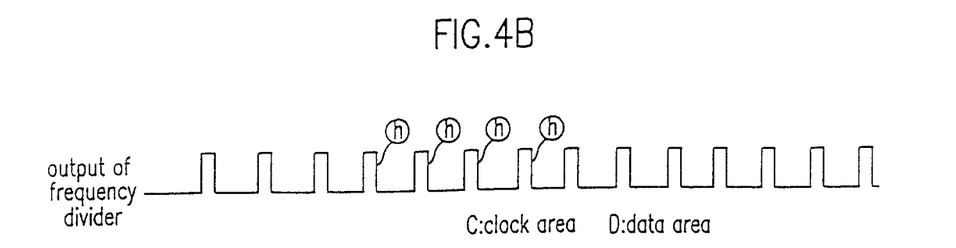
FIG. 4B illustrates the output of the frequency divider illustrated in FIG. 2.
Figure 4C:
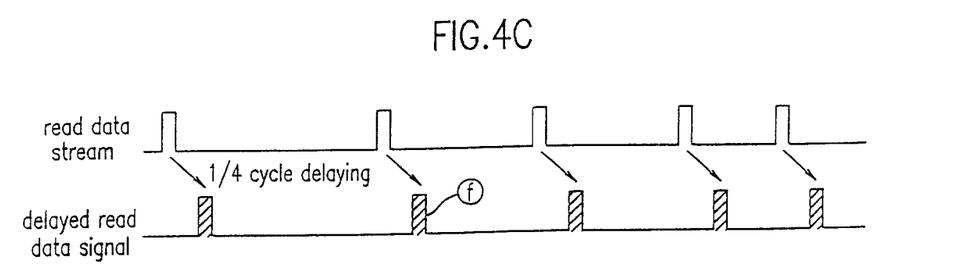
FIG. 4C illustrates the read data stream and the delayed read data signal from which the frequency divider produced the frequency divided signal of FIG. 4B.
Figure 4D:
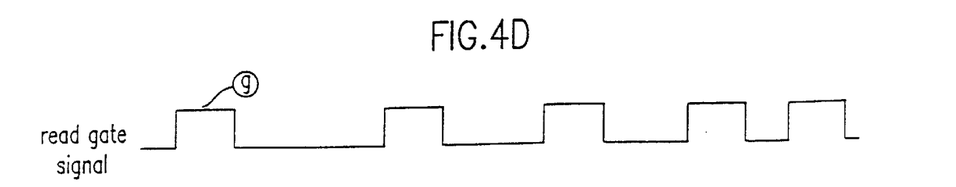
FIG. 4D illustrates the read gate signal generated when the delayed read data signal is as shown in FIG. 4C.

Both the delayed read data stream and the read gate signal are supplied to the multiplexer 24. The delayed read data stream is also supplied to the frequency divider 22 as a reset signal to synchronize the output of the frequency divider 22 with the delayed read data. In accordance with this synchronization, the frequency divider 22 frequency divides the sampling frequency by a predetermined dividing ratio. For instance, the signal output from the frequency divider 22 has a cycle of 1 $\mu$s when the data rate is 500 Kbps. FIG. 4B illustrates the output of the frequency divider 22. As shown in FIG. 4B, the frequency divider 22 outputs a signal having transition pulses h. FIG. 4C illustrates the read data stream and the delayed read data signal from which the frequency divider 22 produced the frequency divided signal of FIG. 4B. FIG. 4D illustrates the read gate signal generated when the delayed read data signal is as shown in FIG. 4C. The duration of the transition pulses of the read gate signal are about 1 $\mu$s. As shown in FIGS. 4C and 4D, the delayed read data signal has transition pulses f, while the read gate signal has transition pulses g.

Figure 4E:
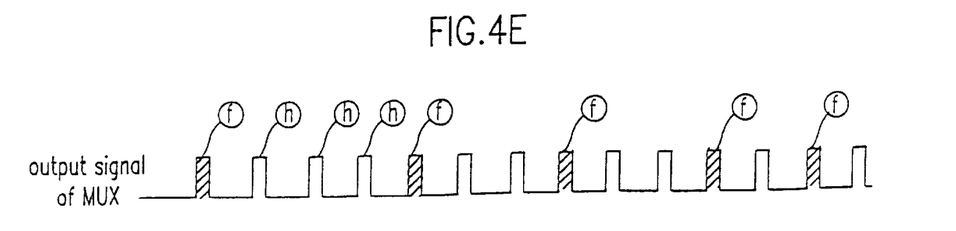
FIG. 4E illustrates the output signal of the multiplexer that serves as an operation clock for the digital phase locked loop illustrated in FIG. 2.

The multiplexer 24 multiplexes the frequency divided signal output by the frequency divider 22 and the delayed read data signal output by the ¼ cycle delaying part 23 in accordance with the read gate signal output by the gate logic determining part 20. In operation, the multiplexer 24 will output the delayed read data signal during a transition pulse g of the read gate signal; otherwise, the multiplexer 24 outputs the frequency divided signal. Accordingly, the multiplexer 24 produces an output signal such as shown in FIG. 4E comprised of transition pulses from the delayed read data signal and the frequency divided signal. As discussed in detail above, the output of the multiplexer 24 serves as a reference clock for the DPLL 29.

The operation of the DPLL 29 will now be described in detail. The phase detecting part 25 of the DPLL 29 receives both the window signal and the output of the multiplexer 24. The phase detecting part 25 produces a first error signal i and a second error signal j indicative of phase error in a first and second direction, respectively. The phase detecting part 25 generates the error signal i and the second error signal j by determining a phase difference state between the reference clock and the window signal as shown in FIG. 6.

Figure 6:
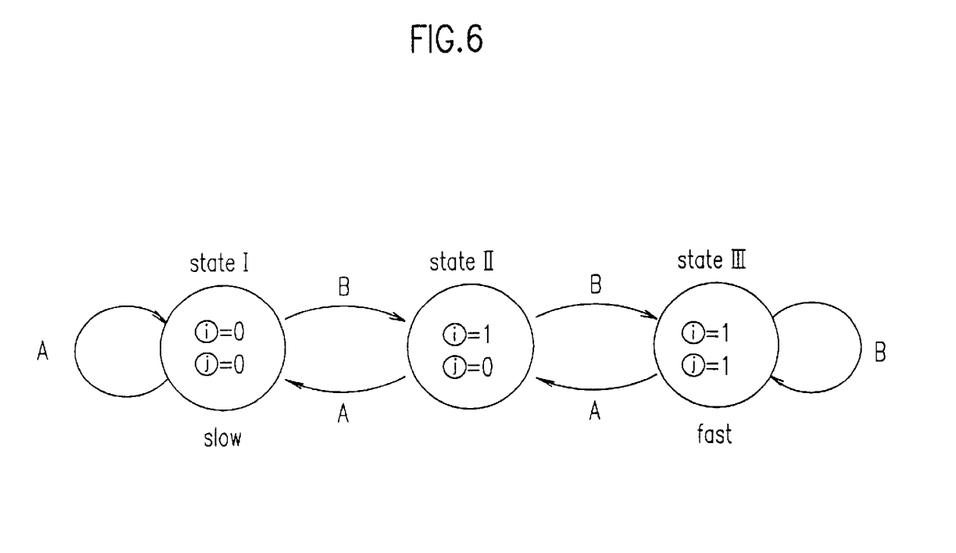
FIG. 6 illustrates the state diagram for generating phase error signals implemented by the phase detecting part of FIG. 2.

State II in FIG. 6 represents the normal operation state. In the normal operation state, the phase detecting part 25 outputs a first error signal i of "1" (i.e., logic level high) and a second error signal j of "0" (i.e., logic level low). The phase detecting part 25 changes state based on the receipt of transition pulses of the reference clock and the window signal. Receipt of a transition pulse of the reference clock from the multiplexer 24 is indicated as condition B in FIG. 6, while receipt of a transition pulse of the window signal is indicated as condition A in FIG. 6.

In state II, if the phase detecting part 25 receives a transition pulse of the reference clock, the phase detecting part 25 switches to state III. In state III, the phase detecting part 25 outputs "1" as both the first error signal i and the second error signal j. In state III, if the phase detecting part 25 receives a transition pulse from the multiplexer 24, then the phase detecting part 25 remains in state III. If, however, the phase detecting part 25 receives a transition pulse of the window signal, then the phase detecting part 25 changes from state III to state II.

In state II, if the phase detecting part 25 receives a transition pulse of the window signal, the phase detecting part 25 switches to state I. In state I, the phase detecting part outputs "0" as both the first error signal i and the second error signal j. While in state I, if the phase detecting part 25 receives a transition pulse of the window signal, then the phase detecting part 25 remains in state I. If, however, the phase detecting part 25 receives a transition pulse from the multiplexer 24, the phase detecting part 25 switches from state I to state II. As indicated in FIG. 6, state III represents the fast state wherein the data rate of data being read from the floppy disk has increased, while state I represents the slow state wherein the data rate of data being read from the floppy disk has decreased.

The phase/frequency controlling part 26 receives both the first error signal i and the second error signal j. The phase/frequency controlling part 26 measures the total amount of time the phase detecting part 25 achieves state III during a predetermining period of time, and also measures the total amount of time the phase detecting part 25 achieves state I during the predetermined period of time. The phase/frequency controlling part 26 establishes the predetermined period of time as the time period between leading edges of consecutively received read gate signals. This operation will be described in greater detail with respect to FIGS. 7A–7C.

Figure 7A:
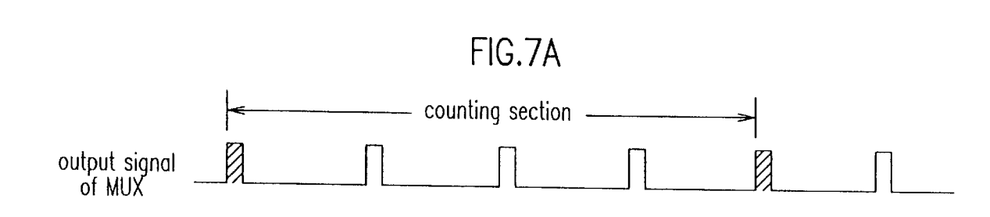
FIG. 7A illustrates the output of the multiplexer illustrated in FIG. 2.

FIG. 7A illustrates the output of the multiplexer 24. As shown in FIG. 7A, the predetermined period of time referred to as the counting section coincides with the leading edge of consecutively received transition pulses f in the output of the multiplexer 24. For purposes of discussion, it has been assumed that the leading edges of the transition pulses f coincide with the leading edges of consecutively received transition pulses of the read gate signal.

Figure 7B:
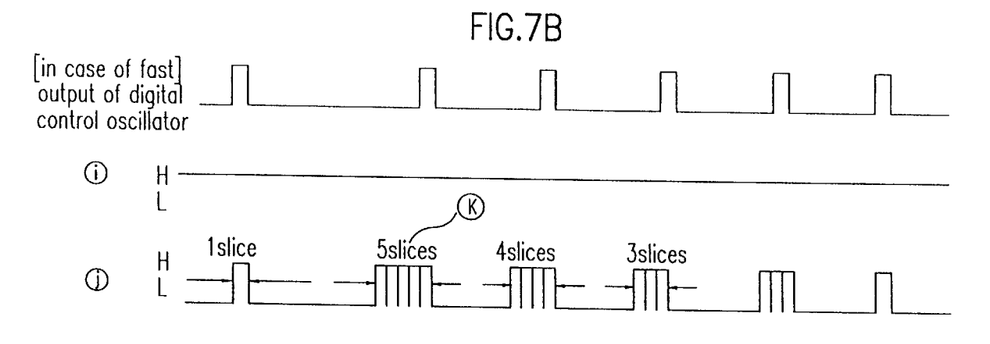
FIG. 7B illustrates a window signal having transition pulses lagging the transition pulses of the reference clock of FIG. 7A and the resulting phase error signals.

When the fast state occurs, the transition pulses of the window signal such as shown in FIG. 7B lag behind the transition pulses of the reference clock output by the multiplexer 24 shown in FIG. 7A. Consequently, the phase detecting part 25 produces the first error signal i and the second error signal j as shown in FIG. 7B.

During the counting section, the phase/frequency controlling part 26 measures the number of transition pulses of the sampling frequency signal (i.e., slices) which occur when the first error signal i is low to produce a first count, and measures the number of slices during the counting section when the second error signal j is high to produce a second count. For instance, in FIG. 7B, the first count will be 0, while the second count will be 13.

Figure 7C:
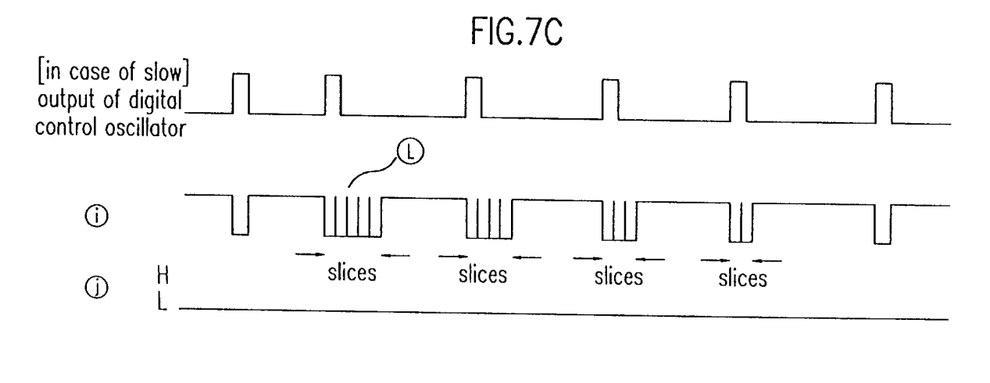
FIG. 7C illustrates a window signal having transition pulses leading the transition pulse of the reference clock of FIG. 7A and the resulting phase error signals.

FIG. 7C illustrates the slow state where the transition pulses of the window signal lead the transition pulses of the reference clock output by the multiplexer 24. In this instance, the phase detecting part 25 generates first error signal i and a second error signal j as shown in FIG. 7C. In the case of FIG. 7C, the phase/frequency controlling part 26 will generate a first count of 15, and a second count of 0.

Figure 8:
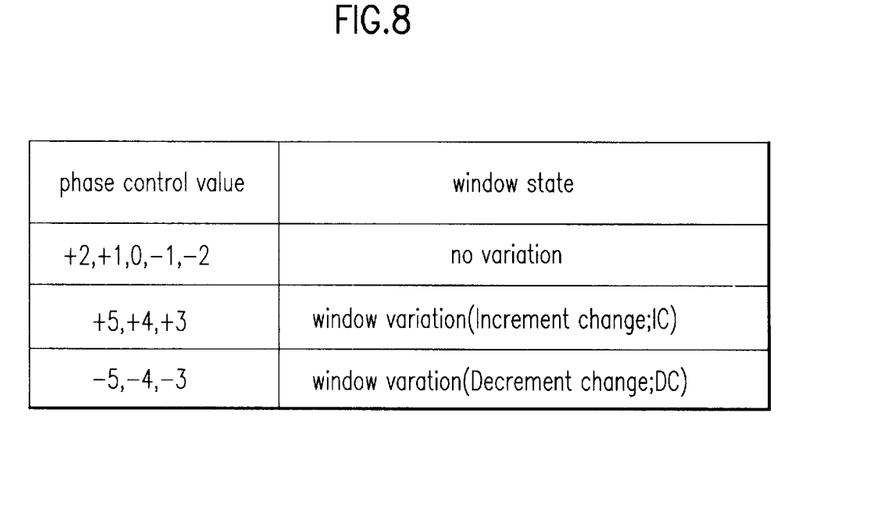
FIG. 8 illustrates a table of the control signals generated based on the phase control values.

After generating the first and second count, the phase/frequency controlling part 26 then generates a control signal. The control signal may be a no change (NC) control signal, an increment change (IC) control signal, and a decrement change (DC) control signal. The control signal is generated by summing the first and second counts to produce a phase control value. Then, in accordance with FIG. 8, the phase/frequency controlling part 26 determines whether or not to produce an NC control signal, IC control signal, or DC control signal. As shown in FIG. 8, when the phase control value is between +2 and −2, the phase/frequency controlling part 26 generates an NC control signal. When the phase control value exceeds +2, the phase/frequency controlling part 26 generates an IC control signal, and when the phase control value is below −2, the phase/frequency controlling part 26 generates a DC control signal.

Figure 9:
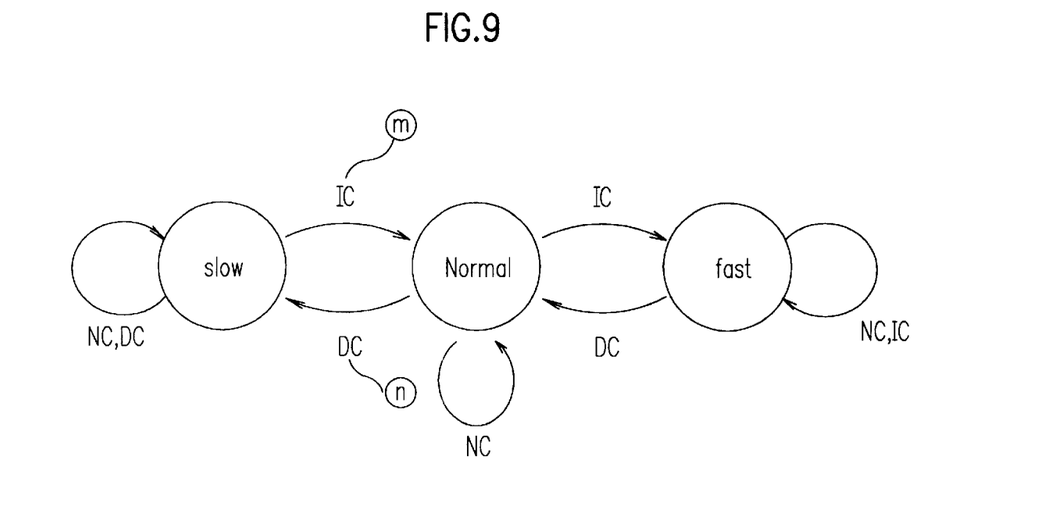
FIG. 9 illustrates the operation state achieved in accordance with the control signal output by the phase/frequency controlling part illustrated in FIG. 2.

FIG. 9 illustrates the operation state achieved in accordance with the control signal output by the phase/frequency controlling part 26. As shown in FIG. 9, in the normal operation state, if an NC control signal is received, the normal operation state is maintained. If, however, an IC control signal is received, then the fast operation state (i.e., the state when the data rate has increased) is achieved. While in the fast state, if an NC or IC control signal is received, the fast state is maintained, while if a DC control signal is received, the state changes from the fast state to the normal state.

When in the normal state, if a DC control signal is received, the slow state is achieved. While in the slow state, if an NC or DC control signal is received, the slow state is maintained. If an IC control signal is received, then the state changes from the slow state to the normal state.

Figure 10A:
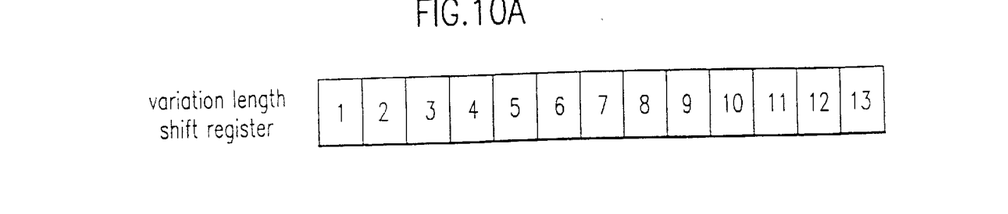
FIG. 10A illustrates a variation length shift register.
Figure 10B:
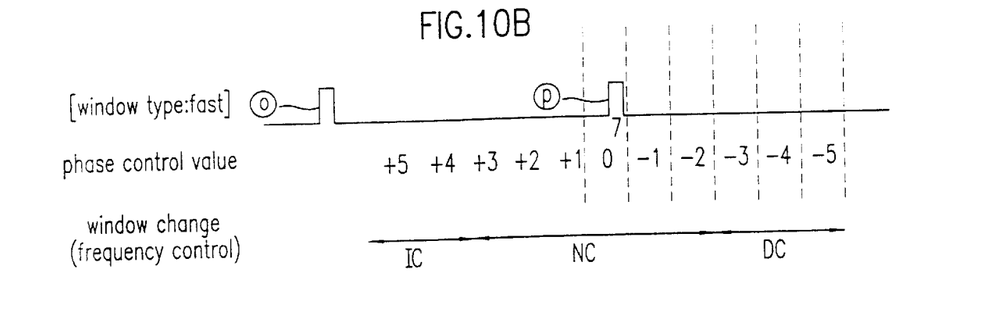
FIG. 10B illustrates the generation of the next transition pulse for the window signal in the fast state.
Figure 10C:
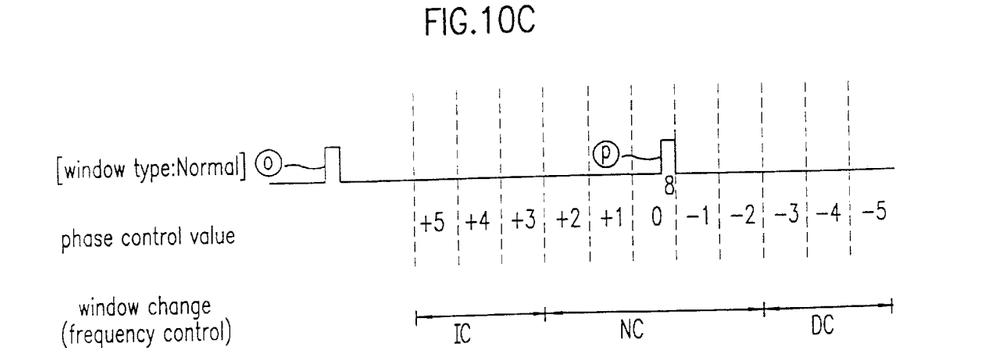
FIG. 10C illustrates the generation of the next transition pulse for the window signal in the normal state.

The digital control oscillator 27 receives the control signal from the phase/frequency controlling part 16. The operation of the digital control oscillator 27 will be described with respect to FIGS. 10A–10D. As shown in FIG. 10A, the digital control oscillator 27 includes a variation length shift register. For purposes of discussion, FIG. 10C will be assumed to represent the normal operation state such as shown in FIG. 9. FIG. 10C illustrates the time period between the previously generated transition pulse o and a next transition pulse p of the window signal, the relationship between consecutively generated pulses with respect to the variation length shift register, the relationship with respect to the phase control value to be determined by the phase/frequency controlling part 26, and the control signal generation ranges. Accordingly, as long as the NC control signal is received by the digital control oscillator 27, the digital control oscillator 27 will continue to generate a next transition pulse p at the frequency established in 10C.

If, however, the digital control oscillator 27 receives an IC control signal indicating the fast state, the digital control oscillator 27 decrements the period between consecutively generated transition pulses of the window signal by one cycle of the sampling frequency signal. This earlier generation of the next transition pulse p of the window signal is illustrated in FIG. 10B. FIG. 10B also illustrates the new relationship between the window signal and the phase control values and the relationship between the window signal and the control signal generation ranges. In accordance with subsequently received IC signals, the digital control oscillator 27 will further decrement the time period between consecutively generated transition pulses of the window signal.

Figure 10D:
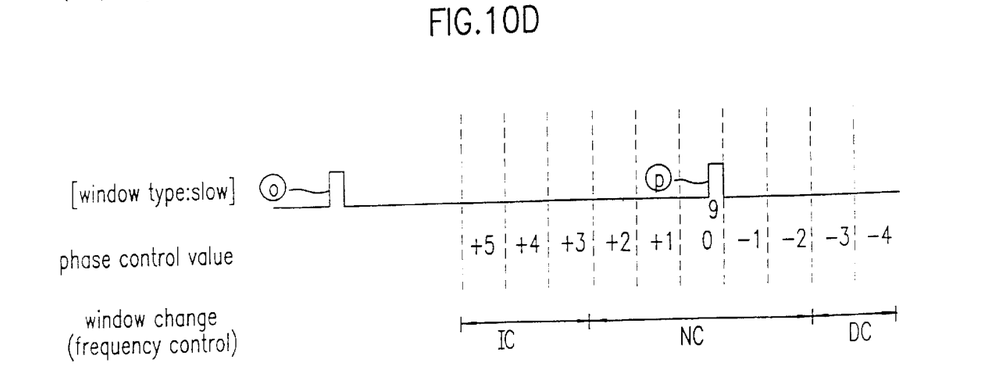
FIG. 10D illustrates the generation of the next transition pulse for the window signal in the slow state.

If the digital control signal 27, however, receives a DC signal, then the digital control oscillator 27 will lengthen the time period between the previously generated transition pulse 0 and the next transition pulse p of the window signal as shown in FIG. 10D. The time period between consecutively generated transition pulses of the window signal will be incremented by one cycle of the sampling frequency signal. FIG. 10D further illustrates the relationship between the window signal and the phase control values, and the relationship between the window signal and the control signal generation ranges.

In this manner, the digital control oscillator 27 locks the frequency of the window signal to the reference clock such as shown in FIGS. 7A–7C. Therefore, even when the data rate with which data is read from the floppy disk changes as shown by arrows e in FIG. 3B, a corresponding change in the window signal is achieved such that the data/clock signal outputting part 28 can continue to generate a data signal and clock signal from the delayed read data signal.

Because the data separation circuit of the present invention includes the DPLL 29, the data separation circuit does not require the use of a VCO. As such, there is no need to control the frequency, gain, and current component of the VCO. In this manner, the present invention removes the unstable properties resident in conventional data separation circuits utilizing voltage control oscillators. Consequently, even in the face of variations which occur during the manufacturing process, the data separation circuit according to the present invention can stably and more reliably retrieve data read out by a floppy disk drive.

In addition, using the DPLL 29 according to the present invention allows for the data separation circuit to be reduced, and because the DPLL 29 simultaneously controls phase and frequency, the data separation characteristic is enhanced.

While the invention has been described in connection with what is presently considered the most practical and preferred embodiments, it is to be understood that the invention is not limited to the disclosed embodiments, but on the contrary, is intended to cover various modifications and equivalent arrangements included within the spirit and scope of the appended claims.

What is claimed:

1. A data separation circuit, comprising:
   a reference clock generating circuit generating a reference clock according to a data rate at which data is being read;
   a phase detecting part determining a phase difference state between said reference clock and a window signal;
   a digital control oscillator generating a pulse of said window signal based on said phase difference state;
   a phase/frequency controller generating a first count and a second count, said first count representing a total amount of time said phase detecting part determines a first state during a first predetermined period of time, said second count representing a total amount of time said phase detecting part determines a second state during said first predetermined period of time, and said phase/frequency controller generating a control signal based on said first and second counts, wherein said digital control oscillator generating said pulse of said window signal based on said control signal; and
   a data/clock output unit outputting a data signal and a clock signal based on said read data and said window signal.

2. The data separation circuit of claim 1, wherein said reference clock generating circuit comprises:
   a delay part for delaying said read data by a second predetermined period of time to generate a delayed read data;
   a gate logic determiner generating a gate signal based on said read data;
   a reference frequency signal generating unit for generating, in synchronization with said delayed read data, a reference frequency signal having a reference frequency; and
   a multiplexer multiplexing said delayed read data and said reference frequency signal according to said gate signal to produce said reference clock.

3. The data separation circuit of claim 2, wherein said reference frequency signal generating unit comprises:
   a sampling frequency signal generator generating a sampling frequency signal having a fixed frequency; and
   a frequency divider frequency dividing said sampling frequency signal in synchronization with said delayed read data to produce said reference frequency signal.

4. The data separation circuit of claim 3, wherein said gate logic determiner detects a logic state of a read gate based on said read data in synchronization with said sampling frequency signal.

5. The data separation circuit of claim 3, wherein said delay part comprises:
   a plurality of serially connected D-flipflops enabled by said sampling frequency signal, a first one of said plurality of serially connected D-flipflops receiving said read data.

6. The data separation circuit of claim 5, wherein said gate logic determiner comprises:
   an OR gate having a first and second input, said first input connected to an output of a first one of said plurality of serially connected D-flipflops and said second input connected to an output of a last one of said plurality of serially connected D-flipflops; and
   a D-flipflop enabled by output from said OR gate, said D-flipflop having an inverting output and an input connected to each other.

7. The data separation circuit of claim 1, wherein said reference clock generating circuit includes,
   a delay part for delaying said read data by a second predetermined period of time to generate a delayed read data,
   a gate logic determiner generating a gate signal indicating a logic state of a read gate based on said read data,
   a reference frequency signal generating unit for generating, in synchronization with said delayed read data, a reference frequency signal having a reference frequency, and
   a multiplexer multiplexing said delayed read data and said reference frequency signal according to said gate signal to produce said reference clock; and
   said phase/frequency controller defines said first predetermined period of time based on said gate signal.

8. The data separation circuit of claim 1, wherein said reference clock generating circuit includes:
   a delay part for delaying said read data by a predetermined fraction of said predetermined period of time to generate a delayed read data;
   a gate logic determiner generating a gate signal indicating a logic state of a read gate based on said read data;
   a reference frequency signal generating unit generating, in synchronization with said delayed read data, a reference frequency signal having a reference frequency; and
   a multiplexor multiplexing said delayed read data and said reference frequency signal according to said gate signal to produce said reference clock; and
   wherein said phase/frequency controller defines said predetermined period of time based on said gate signal.

9. The data separation circuit of claim 1, wherein said read data is data read by a floppy disk driver.

10. The data separation circuit of claim 1, wherein said phase detecting part determines said first state when said pulse of said window signal is received prior to a pulse of said reference clock and until said pulse of said reference clock is received, and determines said second state when said pulse of said reference clock is received prior to said pulse of said window signal and until said pulse of said window signal is received.

11. The data separation circuit of claim 10, wherein
said phase/frequency controller generates a first control signal when said first count exceeds said second count by a first predetermined number, and generates a second control signal when said second count exceeds said first count by a second predetermined number; and
said digital control oscillator increases a period of time between consecutive pulses of said window signal in response to said first control signal, and decreases said period of time between consecutive pulses of said window signal in response to said second control signal.

12. The data separation circuit of claim 11, wherein
said digital control oscillator includes a variation length shift register.

13. The data separation circuit of claim 1, wherein said phase detecting part detects a phase difference between said reference clock and said window signal, and generates a first and second error signal, said first error signal indicating a phase error in a first direction and said second error signal indicating a phase error in a second direction opposite said first direction, and wherein said digital control oscillator generates said pulse of said window signal based on said first and second error signals.

14. The data separation circuit of claim 13, wherein
said first count represents a total amount of time said phase error in said first direction exists during a predetermined period of time, said second count represents a total amount of time said phase error in said second direction exists during said predetermined period of time.

15. The data separation circuit of claim 14, wherein said phase error in said first direction occurs when said pulse of said window signal is received prior to a pulse of said reference clock and until said pulse of said reference clock is received, and said phase error in said second direction occurs when said pulse of said reference clock is received prior to said pulse of said window signal and until said pulse of said window signal is received.

16. The data separation circuit of claim 15, wherein
said phase/frequency controller generates a first control signal when said first count exceeds said second count by a first predetermined number, and generates a second control signal when said second count exceeds said first count by a second predetermined number; and
said digital control oscillator increases a period of time between consecutive pulses of said window signal in response to said first control signal, and decreases said period of time between consecutive pulses of said window signal in response to said second control signal.

17. The data separation circuit of claim 16, wherein
said digital control oscillator includes a variation length shift register.

18. A method of separating data, comprising the steps of:
(a) generating a reference clock according to a data rate at which data is being read;
(b1) determining a phase difference state between said reference clock and a window signal;
(b2) generating a pulse of said window signal based on said phase difference state;
(b3) generating a first count and a second count, said first count representing a total amount of time said step (b1) determines a first state during a first predetermined period of time, and second count representing a total amount of time said step (b1) determines a second state during said first predetermined period of time;

(b4) generating a control signal based on said first and second counts, and wherein said step (b2) generates said pulse of said window signal based on said control signal; and
(c) outputting a data signal and a clock signal based on said read data and said window signal.

19. A method of claim 18, wherein said step (a) comprises the substeps of:
(a1) delaying said read data by a predetermined fraction of said predetermined period of time to generate a delayed read data;
(a2) generating a gate signal based on said read data;
(a3) generating, in synchronization with said delayed read data, a reference frequency signal having a reference frequency; and
(a4) multiplexing said delayed read data and said reference frequency signal according to said gate signal to produce said reference clock.

20. The method of claim 19, wherein said step (a3) comprises the substeps of:
(a31) generating a sampling frequency signal having a fixed frequency; and
(a32) dividing said sampling frequency signal in synchronization with said delayed read data to produce said reference frequency signal.

21. The method of claim 20, wherein said step (a2) detects a logic state of a read gate based on said read data in synchronization with said sampling frequency signal.

22. The method of claim 18, wherein said step (a) includes the substeps of,
(a1) delaying said read data by a second predetermined period of time to generate a delayed read data,
(a2) generating a gate signal based on said read data,
(a3) generating, in synchronization with said delayed read data, a reference frequency signal having a reference frequency, and
(a4) multiplexing said delayed read data and said reference frequency signal according to said gate signal to produce said reference clock; and wherein
said step (b3) defines said first predetermined period of time based on said gate signal.

23. The method of claim 18, wherein said step (b1) determines said first state when said pulse of said window signal is received prior to a pulse of said reference clock and until said pulse of said reference clock is received, and determines said second state when said pulse of said reference clock is received prior to said pulse of said window signal and until said pulse of said window signal is received.

24. The method of claim 23, wherein
said step (b4) includes the substeps of,
(b41) generating a first control signal when said first count exceeds said second count by a first predetermined number, and
(b42) generating a second control signal when said second count exceeds said first count by a second predetermined number; and
said step (b2) includes the substeps of,
(b21) increasing a period of time between consecutive pulses of said window signal in response to said first control signal, and
(b22) decreasing said period of time between consecutive pulses of said window signal in response to said second control signal.

25. The method of claim 18, wherein said read data is data read by a floppy disk driver.

26. An interface device to interface a disk drive to another device, the interface device comprising:

a sampling frequency generating circuit generating a sampling frequency;

a digital oscillator that outputs a window signal by counting a variable number of oscillations of said sampling frequency according to a count control signal;

a count controller to provide said count control signal based upon a phase difference between said window signal and a rate of data from a data disk drive, wherein said phase difference is determined based on a first count and a second count, said first count representing a total amount of time said phase difference is in a first direction during a predetermined period of time, said second count representing a total amount of time said phase difference is in a second direction opposite said first direction during said predetermined period of time; and a data/clock output unit to output a separated data signal and a separated clock signal based upon said window signal and data from said disk drive.

27. The interface device of claim 26, wherein said count controller is operable to increase or decrease said number of oscillations represented by said count control signal according to whether said window signal lags or exceeds said rate of data of said disk drive.

28. A method to interface a disk drive to another device, the method comprising:

generating a sampling frequency;

outputting a window signal by counting a variable number of oscillations of said sampling frequency according to a count control signal;

providing said count control signal based upon a phase difference between said window signal and a rate of data from a data disk drive, wherein said phase difference is determined based on a first count and a second count, said first count representing a total amount of time said phase difference is in a first direction during a predetermined period of time, said second count representing a total amount of time said phase difference is in a second direction opposite said first direction during said predetermined period of time; and outputting a separated data signal and a separated clock signal based upon said window signal and data from said disk drive.

29. The method of claim 28, further comprising:

increasing or decreasing said number of oscillations represented by said count control signal according to whether said window signal lags or exceeds said rate of data of said disk drive.

30. A method of separating data, comprising:

(a) generating a reference clock according to a data rate at which data is being read;

(b1) detecting a phase difference between said reference clock and a window signal;

(b2) generating first and second error signals, said first error signal indicating a phase error in a first direction and said second error signal indicating a phase error in a second direction opposite said first direction;

(b3) generating a pulse of said window signal based on said first and second error signals; and (b4) generating a first count and a second count, said first count representing a total amount of time said step (b1) determines a first state during a first predetermined period of time, and second count representing a total amount of time said step (b1) determines a second state during said first predetermined period of time;

(c) outputting a data signal and a clock signal based on said read data and said window signal.

31. The method of claim 30, further comprising:

(b5) generating a control signal based on said first and second counts, and wherein said step (b3) generates said pulse of said window signal based on said control signal.

32. The method of claim 31, wherein said step (a) includes the substeps of, (a1) delaying said read data by a second predetermined period of time to generate a delayed read data, (a2) generating a gate signal based on said read data, (a3) generating, in synchronization with said delayed read data, a reference frequency signal having a reference frequency, and (a4) multiplexing said delayed read data and said reference frequency signal according to said gate signal to produce said reference clock; and wherein said step (b4) defines said first predetermined period of time based on said gate signal.

33. The method of claim 31, wherein said step (b1) determines said first state when said pulse of said window signal is received prior to a pulse of said reference clock and until said pulse of said reference clock is received, and determines said second state when said pulse of said reference clock is received prior to said pulse of said window signal and until said pulse of said window signal is received.

34. The method of claim 33, wherein said step (b5) includes the substeps of, (b51) generating a first control signal when said first count exceeds said second count by a first predetermined number, and (b52) generating a second control signal when said second count exceeds said first count by a second predetermined number; and said step (b3) includes the substeps of, (b31) increasing a period of time between consecutive pulses of said window signal in response to said first control signal, and (b32) decreasing said period of time between consecutive pulses of said window signal in response to said second control signal.

* * * * *